United States Patent
Czerw et al.

(10) Patent No.: US 12,381,406 B2
(45) Date of Patent: Aug. 5, 2025

(54) APPARATUS FOR INDICATING A STATUS OF AN ELECTRICAL CABLE

(71) Applicant: Volvo Construction Equipment AB, Eskilstuna (SE)

(72) Inventors: Michal Czerw, Wroclaw (PL); Lukasz Czura, Wroclaw (PL); Monika Wawrzyniak, Kamieniec Wroclawski (PL); Piotr Zamorski, Wroclaw (PL)

(73) Assignee: VOLVO CONSTRUCTION EQUIPMENT AB, Eskilstuna (SE)

( * ) Notice: Subject to any disclaimer, the term of this patent is extended or adjusted under 35 U.S.C. 154(b) by 189 days.

(21) Appl. No.: 18/100,618

(22) Filed: Jan. 24, 2023

(65) Prior Publication Data

US 2023/0246465 A1 Aug. 3, 2023

(30) Foreign Application Priority Data

Jan. 28, 2022 (EP) .................... 22153901

(51) Int. Cl.
 *H02J 7/00* (2006.01)
 *B60L 53/18* (2019.01)
 *G01R 19/165* (2006.01)
 *G01R 27/02* (2006.01)
 *G01R 31/08* (2020.01)
 *H05B 45/10* (2020.01)
 *H05B 45/20* (2020.01)

(52) U.S. Cl.
 CPC ........ *H02J 7/0042* (2013.01); *G01R 19/1659* (2013.01); *G01R 27/02* (2013.01); *G01R 31/083* (2013.01); *H02J 7/0047* (2013.01); *H05B 45/10* (2020.01); *H05B 45/20* (2020.01); *B60L 53/18* (2019.02)

(58) Field of Classification Search
 CPC .. H02J 7/0042; H02J 7/0047; G01R 19/1659; G01R 27/02; G01R 31/083; G01R 19/16576; G01R 27/025; G01R 31/58; G01R 31/52; G01R 19/16547; H05B 45/10; H05B 45/20; B60L 53/18; G08B 5/36; G08B 5/38; G08B 21/185
 See application file for complete search history.

(56) References Cited

U.S. PATENT DOCUMENTS

| | | | |
|---|---|---|---|
| 2008/0191890 A1* | 8/2008 | Gustafsson | G01R 19/145 340/660 |
| 2010/0173182 A1* | 7/2010 | Baxter | H01M 10/4257 429/61 |
| 2018/0058649 A1* | 3/2018 | Hamby | H05K 3/202 |
| 2021/0135466 A1 | 5/2021 | Rumbaugh | |

FOREIGN PATENT DOCUMENTS

WO 2021073720 A1 4/2021

OTHER PUBLICATIONS

1 Extended European Search Report, European Patent Application No. 22153901.8, mailed Jul. 8, 2022, 9 pages.

* cited by examiner

*Primary Examiner* — Daniel R Miller
(74) *Attorney, Agent, or Firm* — Sage Patent Group

(57) ABSTRACT

An apparatus including an electrical cable provided with light emitters along its length for visual communication of its position/extent and of statuses of the apparatus, said statuses including at least statuses related an insulation resistance between conductors of the electrical cable. The apparatus is provided with a power unit enabling status updates and light emission also when the electrical cable is disconnected and thus not in use.

15 Claims, 2 Drawing Sheets

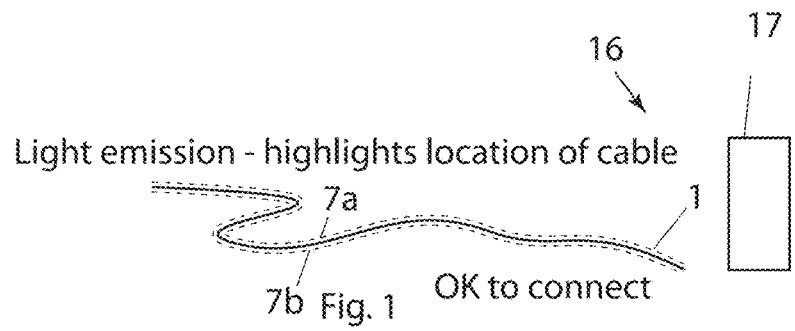
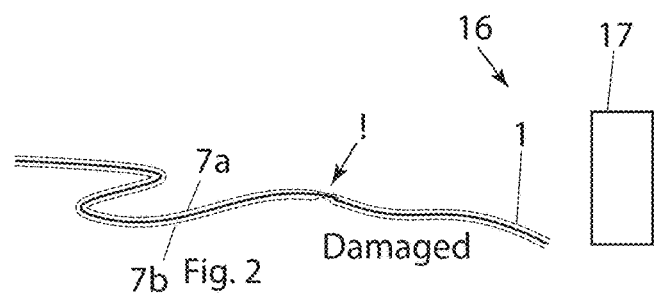
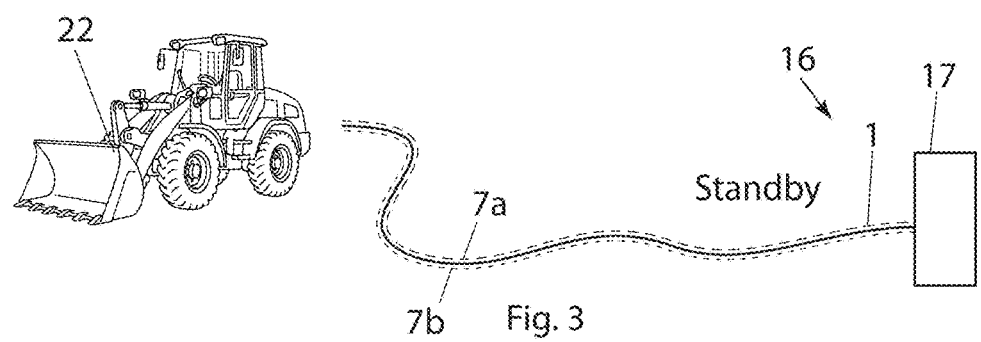
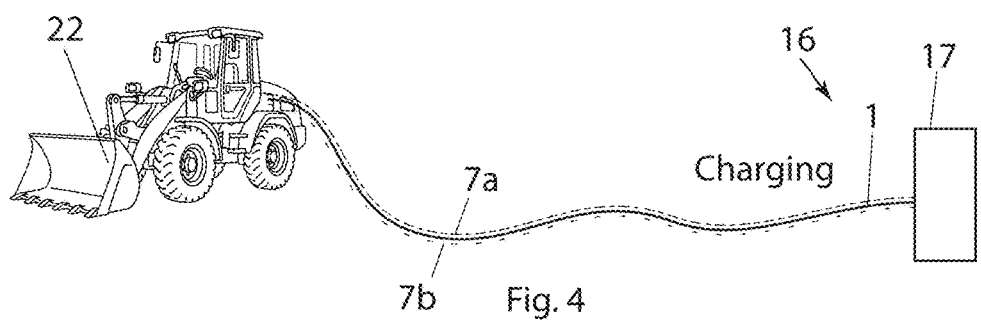
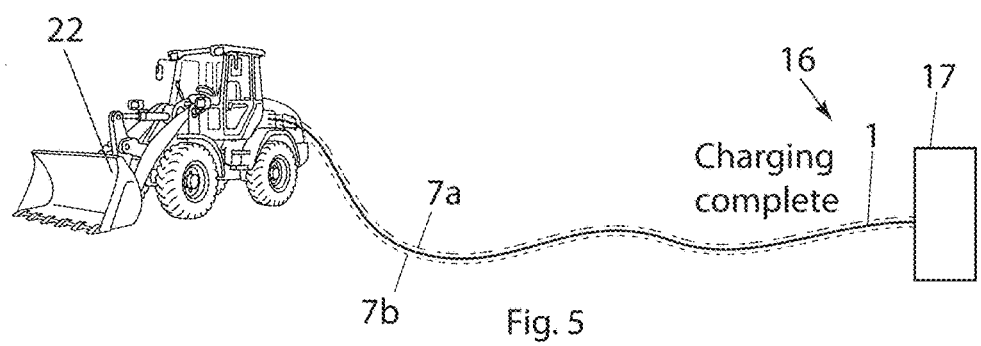

APPARATUS FOR INDICATING A STATUS OF AN ELECTRICAL CABLE

CROSS REFERENCE TO RELATED APPLICATIONS

This application claims priority to European Application No. 22153901.8, filed on Jan. 28, 2022, the disclosure and content of which is incorporated by reference herein in its entirety.

TECHNICAL FIELD

The disclosure relates to visual indication of one or more statuses of an electrical cable suitable for charging of an electrical machine.

The disclosure can be applied in electrical charging systems, for example in electrical charging systems for heavy-duty vehicles, such as trucks, buses and construction equipment.

BACKGROUND OF THE DISCLOSURE

Due to an ongoing electrification within the transport and construction equipment sectors, electric drive systems including e.g. batteries, electric motors/generators and various types of converters are becoming increasingly common in various types of vehicles, including heavy-duty vehicles. In order to gain sufficient power output for large machines, such electric drive systems are usually configured for delivering power at voltage levels which are higher in comparison to traditional vehicles, in which the batteries may deliver power at voltage levels of 12-24V DC. In electrified heavy-duty vehicles such as construction equipment or buses, a voltage level of 600V may typically be needed, and in electrically operated cars, a voltage level of 300V is common. Such voltage levels can cause electric shock and are therefore considered hazardous for humans.

Thus, there is a need for safety procedures and fail-safe systems to deal with the risks associated with such voltage levels on-board vehicles and construction equipment. Such procedures and systems have to some extent already been implemented, for example detailed commissioning/decommissioning procedures and technical measures such as high-voltage interlock loops (HVIL), insulation resistance monitoring devices, and insulated 600V circuits. However, personnel needing to deal with hybrid or electric machines are often stressed to work with potentially hazardous power systems and touch parts that were energized minutes ago.

US20170010311 discloses a device for indicating that an electrical connector used in mining equipment is safe to disconnect. The device comprises a driving circuit which is parasitically coupled to a conductor of the electrical connector, and an indicator providing a visual indication as to whether the conductor is energized or not.

WO 2021/073720 A1 discloses indication systems for use with charging cables to indicate if the cable is safe to touch. However, the system does not indicate if the cable is safe to connect.

Hence, there is a need of a way to also mitigate hazards related to connection and use of damaged cables.

Definitions

An electrical cable is herein to be understood as an assembly of one or more elongated insulated conductors or wires for transmission of electrical power. The electrical cable may include one or more shielding layer(s). The term "cable" is herein used in short for "electrical cable". The electrical cable may include e.g. two insulated conductors or wires configured to be at different voltage levels. For a direct current (DC) power source, the electrical cable may include one ground conductor or wire, and one positive or negative conductor or wire. For an alternating current (AC) power source, the electrical cable may either include one neutral conductor or wire and one phase conductor or wire, or three phase conductors or wires.

By "hazardous voltage" is herein intended a voltage level that may be considered harmful for humans. Voltage levels above 30V for DC voltage and above 12V for AC voltage are considered hazardous voltages.

SUMMARY OF THE DISCLOSURE

A primary object of the disclosure is to provide an apparatus for reliably indicating a position of an electrical cable and for indicating a status of the electrical cable before the electrical cable is connected and used.

According to a first aspect of the disclosure, this and other objects are achieved by an apparatus according to claim 1 or any of its dependent claims. The apparatus comprises an electrical cable comprising a plurality of conductors. The plurality of conductors may comprise a neutral conductor and at least one phase conductor.

The apparatus further comprises a measuring device comprising resistance measuring means for measuring at least a resistance between at least one pair of the plurality of conductors of the electrical cable. Also, the apparatus comprises light-emitting indicator provided along at least a portion of the length of the electrical cable, such as along at least 50%, more preferably at least 70%, or even more preferably at least 90%, of the length of the electrical cable. The light-emitting indicator comprises a plurality of light emitters distributed along the length of the light-emitting indicator. Further, the apparatus comprises an electronic control unit configured to obtain measurement signal from the measuring device and configured to control emission of light from the light-emitting indicator based on the measurement signal. Also, the apparatus comprises a power unit for powering at least the measuring device, the control unit and the light-emitting indicator.

The power unit powers the electronic control unit, the measuring device and the light-emitting indicator. The power unit may be a battery, such as a li-ion battery. The power unit may be provided in a housing and the power unit may be attached to the electrical cable, for example integrated within an end connector of the electrical cable. The power source may alternatively be provided as a stand-alone unit electrically connected/connectable to the electrical cable, to the electronic control unit and/or to the light-emitting indicator. The light emitters may be light-emitting diodes (LEDs). For example, one or more LED tapes may be used, and/or LEDs/LED tape(s) may be arranged inside a transparent jacket of the electrical cable or of a cable harness including the electrical cable. The measuring device measures resistance between the conductors. The light-emitting indicator is controlled by the electronic control unit to provide a visual indication indicative of a resistance measured by the measuring device, thus enabling indication of a resistance lower than a predetermined threshold, such as a short circuit between the conductors. Such indication could be positive or negative, i.e. the lights could be on if a short is found, or vice versa. Also, the lights could be on at all time, but change color as a short circuit is found, or the indication could be one or more blink patterns depending on the outcome of the resistance measurement. Since the apparatus is powered by the power unit of the apparatus, the apparatus can operate without external power supply, and is thus able to provide visual indication at all times, thereby providing an indication of a short in the electrical cable before the electrical cable is connected to an external power source, such as live voltage. Also, the power unit enables the light-emitting indicator to visually indicate the position of the electrical cable such that damage to the electrical cable is avoided when the electrical cable is positioned on ground or extend through air.

The measuring device may also be provided with voltage measuring means for measuring a voltage between at least one pair of the plurality of conductors of the electrical cable.

By configuring the measuring device to not only measure resistance, but to also measure voltage between the conductors, the apparatus is able to determine a voltage state, which is useful for determining whether the electrical cable is carrying a live voltage or not, such that resistance measurements between conductors of the electrical cable can be made when no voltage is sensed in the electrical cable.

The electronic control unit may be configured to repeatedly perform resistance measurements using the measuring device, with pauses between measurements, and accordingly control emission of light from the light-emitting indicator based on the measurement signal.

By repeatedly performing resistance measurements with pauses between the measurements, the power of the power unit will be consumed at a slower pace as compared to continuously measuring resistance. Hence, the apparatus will be able to operate for a longer period of time despite running on a limited power source. Further, the pauses between measurements enable use of the electrical cable for carrying live voltage between the measurements.

The apparatus may comprise one or more switches for optionally disconnecting a respective conductor between a power inlet end of the electrical cable and the measuring device, wherein the electronic control unit is configured to operate the one or more switches to disconnect conductors at the power inlet end before resistance measurements are made.

By providing switches and operating them prior to taking resistance measurements, the electronics of the measuring device is isolated from the source of live voltage, such as an electrical charger to which the electrical cable is connected, thus protecting the electronics of the measuring device and enabling testing of the electrical cable without relying on disconnection from the electrical charger or switching off the power from the electrical charger. The switch thus acts to isolate the conductor from live voltage. When the conductor is isolated from live voltage, its voltage will be dependent only on voltage supplied by the measuring device, such that reliable resistance measurements can be achieved without disturbances of live voltage from the electrical charger.

The electrical cable may comprise a first end and a second end, and switches at both the first end and the second end of the electrical cable for optionally disconnecting a respective conductor. The resistance measuring means is provided between the switches. Further, the electronic control unit is configured to operate the switches to disconnect both ends of a respective conductor before resistance measurements are made.

By providing switches and operating them prior to taking resistance measurements, the electronics of the measuring device is isolated from the source of live voltage, such as an electrical charger and/or machine to which the electrical cable is connected, thus protecting the electronics of the measuring device and enabling testing of the electrical cable without relying on disconnection from the electrical charger/machine or relying on switching off the power from the electrical charger. The switch thus acts to isolate the conductor from live voltage from both ends of the electrical cable, even if both ends would be connected to charger and machine (to be) charged. When the conductor is isolated from live voltage, its voltage will be dependent only on voltage supplied by the measuring device, such that reliable resistance measurements can be achieved without disturbances of live voltage from the electrical charger or from the machine connected.

The control unit may be configured to control at least one of a color, an intensity and a flashing pattern of light emitted from the light-emitting indicator based on the measurement signal.

Changes in color, intensity and/or flashing pattern are easily recognized by a human looking at the electrical cable and different states of the electrical cable can thus be recognized.

The light-emitting indicator may be configured such that different groups of light emitters of the plurality of light emitters, are individually controllable by the electronic control unit.

By using different group of individually controllable light emitters, the light-emitting indicator is able to simultaneously indicate different states, such as a charging state and a voltage state by assigning differently looking light emission to the different groups of light emitters. For example, every other light emitter could belong to a first group and the light emitters between those could belong to a second group.

Alternatively, each different group of light emitters may be provided in the form of one or more led strips comprising a plurality of light emitters all belonging to the same group.

Each conductor may be provided with an insulation layer, wherein the electrical cable comprises a contacting portion at which the measuring device electrically contacts the conductors, and wherein the insulation layer is open at the contacting portion. Electrical insulation members are provided between the conductors at the contacting portion.

By opening the insulation layer, the contact can be established between the conductors and the measuring device. By providing the electrical insulation members between the conductors, shorts between the conductors are mitigated.

The electronic control unit may be configured to determine at least a resistance status of the electrical cable, based on the measured resistance, to one of at least a low-resistance status and a high-resistance status. The low-resistance status is associated with a measured resistance below a first predefinable threshold level or within a first predefinable range. Further, the high-resistance status is associated with the measured resistance being above the first predefinable threshold level or within a second predefinable range. Also, the electronic control unit is further configured to control the emission of light based on at least the determined resistance status.

Each one of the at least low-resistance status and high-resistance status may be associated with the emission of light of at least one of a predefinable distinguishing color, a predefinable distinguishing intensity and a predefinable distinguishing flashing pattern.

For example, a low-resistance status may be associated with a blinking red light or a steady red light. A high-resistance status may be associated with a single color, such as green, or with different colors depending on the level of voltage in the electrical cable during charging, such as green for voltages lower than 30V and blinking red for voltages of at least 30V.

The electronic control unit may further be configured to determine a voltage status of the electrical cable based on the measured voltage, to one of at least a low-voltage status and a high-voltage status. The low-voltage status is associated with a measured voltage below a second predefinable threshold level or within a third predefinable range. Further, the high-voltage status is associated with the measured voltage being above the second predefinable threshold level or within a fourth predefinable range. Also, the electronic control unit is configured to further control the emission of light also based on the determined voltage status.

Each one of the at least low-voltage status and high-voltage statuses may be associated with the emission of light of at least one of a predefinable distinguishing color, a predefinable distinguishing intensity and a predefinable distinguishing flashing pattern.

Changes in color, intensity and/or flashing pattern are easily recognized by a human looking at the electrical cable and different states of the electrical cable can thus be recognized. The use of a respective distinguishing color, intensity or flashing pattern ensures multiple voltage states can be recognized by looking at the electrical cable. For example, a high-voltage state may be associated with a red steady light or a red blinking light. Also, a low-voltage state may be recognized by a green steady light. The controller may be configured such that the light emitters always emit a distinguishing malfunction warning light, such as a blinking red light, if a short circuit is found at resistance measurement in the electrical cable. Hence, the light at malfunction should preferably be distinguishable from the light associated with high-voltage status.

According to a second aspect of the disclosure an electrical charging system is provided. The electrical charging system comprises an electrical charger and the apparatus according the first aspect.

The electrical charger and apparatus are configured to be used together to transfer power to a machine/device charged.

The apparatus may comprise a first signal interface and a second signal interface, wherein the first signal interface and the second signal interface are adapted to communicate.

By enabling communication between the apparatus and the electrical charger, a one-way or a two-way communication between the apparatus and the electrical charger may be used to keep track of states of the electrical charger and/or of the apparatus. The signal interfaces may be wired interfaces and/or wireless interfaces. Also, the electronic control unit of the apparatus may be configured to emit a signal informing the electrical charger of a malfunction of the electrical cable, such as a low-resistance state, wherein the electrical charger can be configured to disable charging accordingly. Further, the electronic control unit of the apparatus may be configured to emit control signals to the electrical charger to enable the electrical charger to be controlled by the electronic control unit of the apparatus. For example, the apparatus may control the control switches in the electrical charger, such as relays, to temporarily disable charging before resistance measurements are made, and subsequently resume the preceding charging state, such as re-enabling charging by controlling the switches of the electrical charger. Similarly, the electrical charger could inform the electronic control unit of the apparatus of a malfunction in the electrical charger, wherein the apparatus may act accordingly by operating switches of the apparatus to disconnect the conductors of the electrical cable of the apparatus.

The electrical charger comprises may comprise one or more switches for optionally disconnecting a respective conductor, wherein the electronic control unit is configured to control operation of the one or more switches of the electrical charger.

The provision of one or more switches inside the electrical charger enables disconnection of conductors independently of any switches inside the apparatus. The electronic control unit uses the measurement signal from the measuring device to determine when to operate the respective switch (es) of the electrical charger to disconnect the conductor(s). Normally, the switches in the electrical charger are closed, but when a short circuit/low resistance condition is determined, the associated conductor(s) are disconnected to thereby prevent a live voltage from being distributed past the switch to the conductor(s) of the electrical cable.

BRIEF DESCRIPTION OF THE DRAWINGS

FIGS. 1-5 show a schematic view of various states of an apparatus according to a first embodiment of the disclosure along with an electrical charger for use with said apparatus.

FIGS. 3-5 also show a machine for being charged with said apparatus.

TABLE 1

|  | Cable internal resistance | Cable damaged? | Cable voltage | 1st group of LEDs | 2nd group of LEDs |
| --- | --- | --- | --- | --- | --- |
| FIG. 1 | High --> | Not damaged | Low | Safety indication: OK - Low voltage | Safety indication: OK - Low voltage |
| FIG. 2 | Low --> | Damaged | Low | Safety indication: Cable damage | Safety indication: Cable damage |
| FIG. 3 | High --> | Not damaged | Low | Charging indication: Standby | Safety indication: OK - Low voltage |
| FIG. 4 | High --> | Not damaged | High | Charging indication: Charging | Safety indication: OK - High voltage |
| FIG. 5 | High --> | Not damaged | Low | Charging indication: Charging complete | Safety indication: OK - Low voltage |

Figure 6:
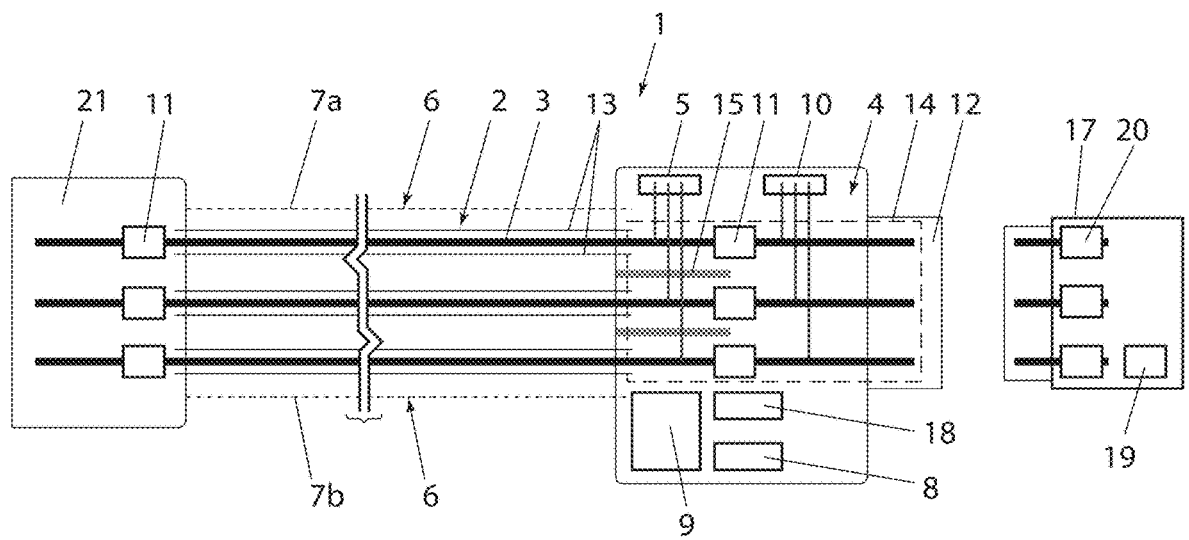

FIG. 6 shows a schematic view of components of the apparatus according to the first embodiment. Only the opposite end portions of the electrical cable are shown and a central portion of the electrical cable is thus omitted in FIG. 6.

Figure 7:
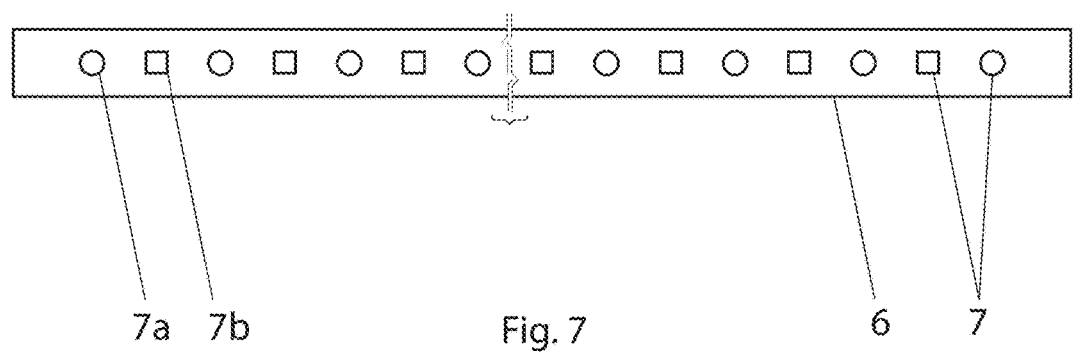

FIG. 7 shows a first embodiment of a light-emitting indicator using individually addressable/controllable light emitters in the form of LEDs on a LED strip. The light emitters are controlled such that a first groups of light emitters can display a light emission distinguishable from a light emission from a second group of light emitters on the same LED strip. Depending on the status of the electrical cable, the first and second groups may also emit the same type of light emission (a color, an intensity and/or a flashing pattern of light).

Figure 8:
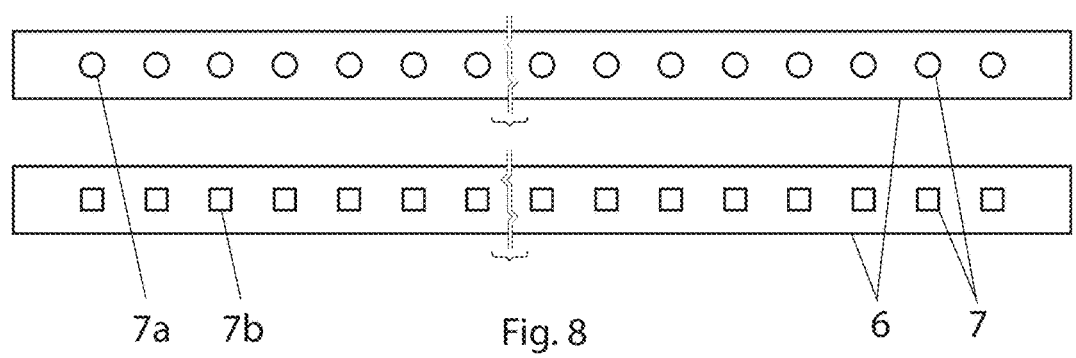

FIG. 8 shows a second embodiment of a light-emitting indicator using LED-strips where all light emitters emit the same light, i.e. not individually addressable LEDs. Instead, a plurality of LED-strips are used to provide a plurality of groups of light emitters, each capable of emitting light distinguishable from light emitted by another one of the groups of light emitters. Hence, a first group of light emitters is provided on a first LED strip and a second group of light emitters is provided on a second LED strip.

The drawings show exemplifying embodiments and are not drawn to scale. It shall be understood that the embodiments shown and described are exemplifying and that the disclosure is not limited to these embodiments. It shall also be noted that some details in the drawings may be exaggerated in order to better describe and illustrate the disclosure. Like reference characters refer to like elements throughout the description, unless expressed otherwise.

DETAILED DESCRIPTION

As shown in FIG. 6, an apparatus according to a first embodiment of the disclosure comprises an electrical cable 2 comprising a plurality of conductors 3. The apparatus 1 further comprises a measuring device 4 comprising resistance measuring means 5 for measuring at least a resistance between at least one pair of the plurality of conductors 3 of the electrical cable 2.

The apparatus 1 also comprises a light-emitting indicator 6 provided along the full length of the electrical cable 2. In other embodiments, the light-emitting indicator 6 may alternatively have a shorter extent along only a portion of the length of the electrical cable 2, such as along at least 50%, more preferably at least 70%, or even more preferably at least 90%, of the length of the electrical cable 2.

The light-emitting indicator 6 comprises a plurality of light emitters 7 distributed along the length of the light-emitting indicator 6. The light emitters 7 are light-emitting diodes (LEDs) with human-visible light, preferably multi-color LEDs which can be operated to emit different colors of light to signal different states of the apparatus by changing color, such as charging state (standby, charging or full) or safety state (resistance/short circuit or voltage level).

The apparatus 1 further comprises an electronic control unit 8 configured to obtain a measurement signal from the measuring device 4. The signal can be any suitable type of signal depending on the specific implementation of the measuring device 4, such as an analogue signal or a digital signal or a signal carrying data representative of the resistance condition measured.

The electronic control unit 8 is configured to control emission of light from the light-emitting indicator 6 based on the measurement signal.

The apparatus 1 also comprises a power unit 9 for powering at least the measuring device 4, the electronic control unit 8 and the light-emitting indicator 6. The power unit 9 is a lithium-ion battery but may alternatively in other embodiments be some other type of portable power source. The power unit 9 is in this embodiment provided in a housing attached to the electrical cable 2. In other embodiments, the power unit 9 may alternatively be provided as a stand-alone unit electrically connected/connectable to the electrical cable 2, to the electronic control unit 8 and/or to the light-emitting indicator 6 for powering the apparatus.

This apparatus 1 is thus capable of making resistance measurements and emitting light indicating the result of the resistance measurement, thereby enabling a continuous indication of the position of an electrical cable 2 not connected to an electrical charger 17 such that operators of machines operating in the area of the electrical cable 2 are aware of the electrical cable 2, thereby mitigating damages to the electrical cable 2 caused by driving over an electrical cable 2 laying on ground or into an electrical cable 2 extending through the air. It should be understood that the light emitting indication also functions when the electrical cable 2 is connected and when it is in use for charging purposes or any other type of transfer of electrical power through the electrical cable 2.

In this embodiment, the measuring device 4 is provided with voltage measuring means 10 for measuring a voltage between at least one pair of the plurality of conductors 3 of the electrical cable 2. However, in other embodiments, the voltage measuring means 10 may be omitted wherein only resistance measurement would be possible.

The electronic control unit 8 is configured to repeatedly perform resistance measurements using the measuring device 4, with pauses between the resistance measurements, and accordingly control emission of light from the light-emitting indicator 6 based on the measurement signal. During resistance measurements, power is consumed from the power unit 9, thereby draining energy from the power unit 9. By repeatedly performing measurements with pauses between the measurements, less power is used over time, thereby allowing the apparatus 1 to work for a longer time before the power unit 9 needs to be charged or replaced. In other embodiment's, the electronic control unit 8 may alternatively be configured to continuously perform resistance measurements, or to perform resistance measurements in response to a signal received, for example a signal from an electrical charger 17 or other control system, or a signal from a push-button on the apparatus useful for manually triggering an updated resistance measurement. For example, an operator could approach a disconnected electrical cable 2 which currently emits light signaling that the electrical cable 2 is OK (i.e. high resistance between conductors 3) and then operate the push button to trigger an updated resistance check before connecting the electrical cable 2 to an electrical charger 17 or machine 22 to be charged, thereby ensuring the electrical cable 2 is still intact and safe to connect and use.

As shown in FIG. 6, each conductor 3 of the electrical cable 2 is provided with a respective switch 11 at each opposite end portion of the conductor 3, thereby enabling each conductor 3 to be isolated from external voltage. The switches 11 may be any suitable type of electrical switch operable by the electronic control unit 8, in this case the switches 11 are relays. The electronic control unit 8 is configured to operate the one or more switches 11 to disconnect conductors 3 at the power inlet end 12 before resistance measurements are made. In other embodiments, switches 11 may be provided only at the electrical charger end of the conductors 3 or only at the power outlet end 21 of the electrical cable 2, or switches 11 may be omitted altogether.

As shown in FIG. 6, the voltage measuring means 10 contacts the conductors 3 before the switch 11, i.e. between the end of the conductor 3 and the switch 11, thereby enabling voltage measurement of voltage supplied by an electrical charger 17 independently of the open/closed state of the switch 11. In other embodiments, the voltage measuring means 10 may alternatively contact the conductors 3 on the other side of the switch 11, i.e. inside the switch 11/between the switches 11 of the respective conductor 3.

To avoid routing control wire for control of relays at the end of the electrical cable 2 opposite of the end where the electronic control unit 8 is located, an additional second electronic control unit may in other embodiments be provided at the end of the electrical cable 2 opposite of the end where the electronic control unit 8 is located. The second electronic control unit is powered by an additional power unit 9. The two electronic control units may be provided with means for wired or wireless communication and be configured to operate together for controlling the switches 11 at both ends of the electrical cable 2 of the apparatus 1. The second electronic control unit may be configured to act as a slave to the electronic control unit 8, for example controlling the related switches 11 in accordance with a control signal from the (first) electronic control unit 8. The second electronic control unit could alternatively be accompanied by a second measuring device operating on the same principles and the (first) measuring device 4 for making the same type of resistance and/or voltage measurements as the (first) measuring device 4, thereby allowing fully autonomous operation of the switches 11 near the second electronic control unit, i.e. not relying on measurements made by the (first) measuring device 4. The second measuring device thus provides redundancy, should the (first) measuring 4 device fail or run out of power.

As long as the electrical cable 2 is disconnected at both ends, no switches are necessary, since external voltage will not be transmitted to the conductors 3. If the electrical cable 2 is connected to the electrical charger 17, switches at the electrical charger end of the electrical cable 2 are advantageous since they ensure that any voltage from the electrical charger 17 will be disconnected from the conductors 3 before resistance measurements are performed. If the electronic control unit 8 and the electrical charger 17 are configured to communicate, the process can be controlled such that no voltage is supplied by the electrical charger 17 when resistance measurements are to be made. Similarly, if a connected machine communicates with the electronic control unit 8, the machine may switch off switches integrated into the machine before resistance measurements are made by the electronic control unit 8.

In the apparatus 1 according to the first embodiment, the electronic control unit 8 is configured to control at least one of a color, an intensity and a flashing pattern of light emitted from the light-emitting indicator 6 based on the measurement signal.

In the present embodiment, the following differentiation scheme is used for the light emission, although any other suitable differentiation scheme could alternatively be used instead, wherein other colors and blinking/flashing patterns could be employed instead.

TABLE 2

| | |
|---|---|
| Safety indication: Cable OK. Carries low or no voltage | Green continuous |
| Safety indication: OK - Carries high voltage | Red blinking, normal intensity |
| Safety indication: Cable damage | Red blinking, high intensity |
| Charging indication: Standby | Yellow continuous |
| Charging indication: Charging | Blue blinking |
| Charging indication: Charging complete | Blue continuous |
| Charging indication: Malfunction of charging | Yellow blinking |

As shown in FIG. 8, the light-emitting indicator 6 is configured such that different groups of light emitters 7a, 7b of the plurality of light emitters 7, are individually controllable by the electronic control unit 8. The circles in FIGS. 7 and 8 indicate light emitters of the first group 7a and the squares indicate light emitters of the second group 7b, but the square and circle is merely a schematic representation and has nothing to do with the actual shape of the light emitters 7.

In the first embodiment, each different group of light emitters 7a, 7b is provided in the form of a respective led strip comprising a plurality of light emitters 7 all belonging to the same group of light emitters 7a, 7b, as shown in FIG. 8. Alternatively, as shown in FIG. 7, the light-emitting indicator 6 may comprise individually addressable/controllable light emitters 7 in the form of LEDs on a LED strip. The light emitters 7 are controlled such that a first groups of light emitters 7a can display a light emission distinguishable from a light emission from a second group of light emitters 7b on the same LED strip.

As described in Table 1 above, the safety indication and the charging indication may be displayed simultaneously using the two individually controllable groups of light emitters 7a, 7b. Alternatively, the safety indication and the charging indication may be displayed alternatingly on the same group of controllable light emitters 7a, 7b. Alternatively, two individually controllable groups of light emitters 7a, 7b may display the same indication simultaneously, for example the safety indication indicating the electrical cable 2 has a short circuit/is malfunctioning, in order to convey the message with stronger light emission for improved visibility.

Further, the list of different statuses in Table 2 is not limiting and it should be understood that important statuses to identify and distinguish are the one for "undamaged cable" and the one for "damaged cable", i.e. high insulation resistance and low insulation resistance, respectively. Also, the apparatus 1 could in other embodiments, alternatively be configured to support fewer distinguishable statuses or a higher number of distinguishable statuses of the apparatus and possibly also of other important statuses for drawing attention of nearby people, such as statuses of a machine connected to the electrical cable 2.

Each conductor 3 is provided with an insulation layer 13. The electrical cable 2 comprises a contacting portion 14 at which the measuring device 4 electrically contacts the conductors 3. The insulation layer 13 is open at the contacting portion 14. Electrical insulation members 15 are provided between the conductors 3 at the contacting portion 14 to mitigate short circuit between conductors 3. Resistance measurement is made by measuring electrical current within the measuring device 4 when applying a voltage between a pair of conductors 3 of the electrical cable 2, said voltage being supplied by the power unit 9. Preferably, insulation resistance measurements are made between each respective conductor 3 and each one of all other conductors 3 of the electrical cable 2.

The measuring device 4 comprises a DC/DC converter enabling testing at a higher test voltage than the voltage supplied by the power unit 9. The test voltage should preferably be:

250 VDC for electrical cables 2 rated for <60 VDC/AC
500 VDC for electrical cables 2 rated for 60-500 VDC/AC
1000 VDC for electrical cables 2 rated >500 VDC/AC The measuring device 4 is configured to limit the current for testing to 15 mA (in the circuit to which test voltage is applied).

The electronic control unit 8 is configured to determine at least a resistance status of the electrical cable 2, based on the measured resistance, to one of at least a low-resistance status and a high-resistance status. The low-resistance status is associated with a measured resistance below a first predefinable threshold level or within a first predefinable range, and the high-resistance status is associated with the measured resistance being above the first predefinable threshold level or within a second predefinable range. The first predefinable threshold level is chosen according to the operating voltages for which the electrical cable 2 is designed. For cables designed for operation under 60 VDC/AC, the first predefinable threshold level is preferably set to 0.5 MΩ, and for circuits with higher operating voltage the first predefinable threshold level is preferably set to 1 MΩ.

In this embodiment, the electronic control unit 8 is also configured to also determine a voltage status of the electrical cable 2 based on the measured voltage, to one of at least a low-voltage status and a high-voltage status, wherein the low-voltage status is associated with a measured voltage below a second predefinable threshold level or within a third predefinable range, and the high-voltage status is associated with the measured voltage being above the second predefinable threshold level or within a fourth predefinable range. The second predefinable threshold level is chosen according to the operating voltages for which the electrical cable 2 is designed, and in the present embodiment a second threshold level is 30 Volts.

The electronic control unit 8 is configured to control the emission of light based on the determined resistance status and based on the determined voltage status, as shown in Tables 1 and 2. In other embodiments, the electronic control unit 8 may be configured to determine additional1 resistance statuses and/or voltage statuses, such as a medium-resistance status associated with a resistance range between the ranges associated with the low-resistance status and the high-resistance status.

In some embodiments, the apparatus 1 may also be configured to monitor the voltage of each conductor 3 and to determine a charging state indicating a malfunction of charging, once voltage loss is determined in a conductor 3.

The present disclosure also relates to an electrical charging system 16 comprising at least one electrical charger 17 and at the above-described apparatus 1 comprising the electrical cable 2. The apparatus 1 comprises a first signal interface 18 and the electrical charger 17 comprises a second signal interface 19. The first signal interface 18 and the second signal interface 19 may be adapted to communicate through one-way communication in either direction, but preferably with two-way communication. Two-way communication enables the apparatus 1 to control power supply from the electrical charger 17, for example by controlling switches in the electrical charger 17 controlling voltage supply to respective conductors 3 of the electrical cable 2, and to get confirmation. Further, the electrical charger 17 may use the signal interfaces 17, 18 to inform the apparatus 1 of the charge state of the machine charged via the electrical cable 2.

As shown in FIG. 6, the electrical charger 17 may comprises one switches 20 for optionally disconnecting each respective conductor 3. The electronic control unit 8 is preferably configured to control operation of the one or more switches 20 of the electrical charger 17, for example by wired or wireless communication with the electrical charger 17 which acts as a slave to control the switches 20 of the electrical charger 17.

The provision of one or more switches 20 inside the electrical charger enables disconnection of conductors 3 independently of any switches 11 inside the apparatus 1. The electronic control unit 8 may use the measurement signal from the measuring device 4 to determine when to operate the respective switches 20 of the electrical charger 17 to disconnect the conductors 3. Normally, the switches 20 in the electrical charger 17 are closed, but when a short circuit/low resistance condition is determined in the electrical cable 2, the associated conductors 3 are disconnected to thereby prevent a live voltage from being distributed past the switch 20 to the conductors 3 of the electrical cable 2.

| | |
|---|---|
| 1 | apparatus |
| 2 | electrical cable |
| 3 | conductors |
| 4 | measuring device |
| 5 | measuring means for electrical resistance |
| 6 | light-emitting indicator |
| 7 | light emitter |
| 7a | light emitter of first group of light emitters |
| 7b | light emitter of second group of light emitters |
| 8 | electronic control unit |
| 9 | power unit |
| 10 | voltage measuring means |
| 11 | switch in apparatus |
| 12 | power inlet end of electrical cable |
| 13 | insulation layer |
| 14 | contacting portion |
| 15 | electrical insulation member |
| 16 | electrical charging system |
| 17 | electrical charger |
| 18 | first signal interface |
| 19 | second signal interface |
| 20 | switch in charger |
| 21 | power inlet end of electrical cable |
| 22 | machine |

The invention claimed is:
1. An apparatus comprising:
an electrical cable comprising a plurality of conductors,
a measuring device comprising resistance measuring means adapted to measure at least a resistance between at least one pair of the plurality of conductors of the electrical cable, said resistance measuring means being electrically connected to each conductor of said at least one pair of conductors,
a light-emitting indicator provided along at least 50% of the length of the electrical cable, wherein the light-emitting indicator comprises a plurality of light emitters distributed along the length of the light-emitting indicator,
an electronic control unit configured to obtain a measurement signal from the measuring device, and configured to control emission of light from the light-emitting indicator based on the measurement signal, and
a power unit for powering at least the measuring device, the electronic control unit and the light-emitting indicator,
wherein the electrical cable comprises a first end and a second end, and wherein the apparatus comprises switches at both the first end and the second end of the electrical cable for selectively disconnecting a respective conductor of the plurality of conductors, wherein the resistance measuring means is provided between the switches, and wherein the electronic control unit is configured to operate the switches to disconnect both ends of a respective conductor before resistance measurements are made.

2. The apparatus according to claim 1, wherein the measuring device is provided with voltage measuring means for measuring a voltage between at least one pair of the plurality of conductors of the electrical cable.

3. The apparatus according to claim 1, wherein the electronic control unit is configured to repeatedly perform resistance measurements using the measuring device, with pauses between the resistance measurements, and accordingly control emission of light from the light-emitting indicator based on the measurement signal.

4. The apparatus according to claim 1, further comprising one or more switches for selectively disconnecting a respective conductor of the plurality of conductors between a power inlet end of the electrical cable and the measuring device, wherein the electronic control unit is configured to operate the one or more switches to disconnect conductors of the plurality of conductors at the power inlet end before resistance measurements are made.

5. The apparatus according to claim 1, wherein the electronic control unit is configured to control at least one of a color, an intensity and a flashing pattern of light emitted from the light-emitting indicator based on the measurement signal.

6. The apparatus according to claim 1, wherein the light-emitting indicator is configured such that different groups of light emitters of the plurality of light emitters, are individually controllable by the electronic control unit.

7. The apparatus according to claim 6, wherein each different group of light emitters is provided in the form of one or more LED strips comprising a plurality of light emitters.

8. The apparatus according to claim 1, wherein each conductor is provided with an insulation layer,
wherein the electrical cable comprises a contacting portion at which the measuring device electrically contacts the conductors, and
wherein the insulation layer is open at the contacting portion, and wherein electrical insulation members are provided between the conductors at the contacting portion.

9. The apparatus according to claim 1, wherein the electronic control unit is configured to determine at least a resistance status of the electrical cable, based on the measured resistance, to one of at least a low-resistance status and a high-resistance status, wherein the low-resistance status is associated with a measured resistance below a first predefinable threshold level or within a first predefinable range, and the high-resistance status is associated with the measured resistance being above the first predefinable threshold level or within a second predefinable range, and wherein the electronic control unit is further configured to control the emission of light based on at least the determined resistance status.

10. The apparatus according to claim 9, wherein each one of the at least low-resistance status and high-resistance status is associated with the emission of light of at least one of a predefinable distinguishing color, a predefinable distinguishing intensity and a predefinable distinguishing flashing pattern.

11. The apparatus according to claim 9, wherein the measuring device is provided with voltage measuring means for measuring a voltage between at least one pair of the plurality of conductors of the electrical cable, and
wherein the electronic control unit is further configured to determine a voltage status of the electrical cable based on the measured voltage, to one of at least a low-voltage status and a high-voltage status, wherein the low-voltage status is associated with a measured voltage below a second predefinable threshold level or within a third predefinable range, and the high-voltage status is associated with the measured voltage being above the second predefinable threshold level or within a fourth predefinable range, and wherein the electronic control unit is further configured to control the emission of light based on the determined voltage status.

12. The apparatus according to claim 11, wherein each one of the at least low-voltage status and high-voltage status is associated with the emission of light of at least one of a predefinable distinguishing color, a predefinable distinguishing intensity and a predefinable distinguishing flashing pattern.

13. An electrical charging system for a vehicle, wherein the electrical charging system comprises at least one electrical charger and the apparatus according to claim 1.

14. The electrical charging system according to claim 13, wherein the apparatus comprises a first signal interface and wherein the electrical charger comprises a second signal interface, wherein the first signal interface and the second signal interface are adapted to communicate.

15. The electrical charging system according to claim 14, wherein the electrical charger comprises one or more switches for selectively disconnecting a respective conductor, wherein the electronic control unit is configured to control operation of the one or more switches of the electrical charger.

* * * * *